United States Patent [19]

Itoh

[11] Patent Number: 5,379,830
[45] Date of Patent: Jan. 10, 1995

[54] HEAT PIPE AND RADIATING DEVICE

[75] Inventor: Akira Itoh, Osaka, Japan

[73] Assignee: Itoh Research & Development Laboratory Co., Ltd., Osaka, Japan

[21] Appl. No.: 90,335

[22] Filed: Jul. 8, 1993

[30] Foreign Application Priority Data

Sep. 17, 1992 [JP] Japan .................. 4-248149

[51] Int. Cl.⁶ .............................................. F28D 15/02
[52] U.S. Cl. .................. 165/104.27; 165/104.14; 165/104.33; 29/890.032
[58] Field of Search ............. 165/104.27, 104.14; 29/890.032

[56] References Cited

U.S. PATENT DOCUMENTS 4,776,389 10/1988 Murphy .................. 165/104.27
5,029,389 7/1991 Tanzer .................... 29/890.032

FOREIGN PATENT DOCUMENTS 1064116 12/1983 U.S.S.R. .................. 165/104.27
1719868 3/1992 U.S.S.R. .................. 29/890.032

Primary Examiner—Albert W. Davis, Jr.
Attorney, Agent, or Firm—W. G. Fasse; W. F. Fasse

[57] ABSTRACT

A heat pipe includes a pipe, a bottom plate, and a cap plate. The cap plate includes a vertical aperture extending so as to be penetrated vertically and a horizontal aperture extending from the side surface to the vertical aperture. A sleeve having a through hole extending vertically is attached to the vertical aperture of the cap plate. A working fluid serving as heat carrier repeating evaporation and condensation is introduced into the pipe from the through hole of the sleeve. The sleeve is deformed by impact externally applied through the horizontal aperture, so that the through hole is closed. A radiating device includes a base block having a plurality of guide grooves on the upper surface, and a plurality of heat pipes having the bottom portions fitted to be secured into the guide groove. The structure of the heat pipes is the same as that of the above-described heat pipe.

9 Claims, 8 Drawing Sheets

HEAT PIPE AND RADIATING DEVICE

BACKGROUND OF THE INVENTION

1. Field of the Invention

The present invention relates to a heat pipe and a radiating device for radiating heat of an electronic component such as a semiconductor integrated circuit package to the atmosphere.

2. Description of the Background Art

Recently, higher responsiveness and higher integration of an integrated circuit used for electronic devices such as computers have been in greater demand. Accordingly, density of power consumption of an integrated circuit has been increased, and the temperature of the electronic component in operation has been increased. In order to cool the electronic component, a radiating device such as a heat pipe and a heat sink has been used.

FIG. 10 illustrates a heat pipe 2 placed on a semiconductor integrated circuit package 1. A heat pipe is obtained by reducing inner pressure of an air tight container formed by closing both ends of a pipe, and by sealing a little heat carrier such as water or alcohol, which is called a working fluid. At a heated portion of the heat pipe, the liquid turns into steam or gas, the gas radiates heat when it moves apart from the heated portion, and turns into liquid. The liquid returns to the heated portion because of capillary action. The heat is transmitted from the heated portion to the radiating portion by the repetition of this phenomenon.

FIGS. 11A and 11B show, enlarged, a, heat pipe 2, wherein FIG. 10A is a perspective view and FIG. 10B is a cross sectional view.

Heat pipe 2 includes a pipe 3 having a rectangular cross section, a bottom wall 4 closing the bottom portion of pipe 3, and a cap plate 5 closing the top portion of pipe 3. A working fluid 9 serving as heat carrier repeating evaporation and condensation is sealed in pipe 3. A plurality of grooves 10 serving as a passage through which the condensed working fluid returns are formed in the inner wall surface of pipe 3.

FIGS. 12A, 12B, and 12C show a sequence of steps of manufacturing heat pipe 2. As shown in FIG. 12A, cap plate 5 has a column 6 at the center. A through hole 7 is formed in column 6. A working fluid as heat carrier repeating evaporation and condensation is introduced into pipe 3 from through hole 7.

As shown in FIG. 12B, after introduction of the working fluid, the center portion of column 6 is squeezed by a pair of pliers, indicated by arrows causing through hole 7 to be closed. The portion positioned above the crushed portion is cut away from column 6.

Thereafter, as shown in FIG. 12C, the squeezed portion of column 6 is covered by a solder 8 in order to prevent gas leakage.

As shown in FIGS. 11A and 11B, the conventional heat pipe 2 includes column 6 protruding from the top surface of cap plate 5. Although heat pipe 2 functions to radiate heat received from the semiconductor integrated circuit package to the atmosphere, the portion contributing to the radiating function is a length $L_0$ from the bottom surface of bottom wall 4 to the top surface of cap plate 5. In other words, the effective length of heat pipe 2 is $L_0$. A length $L_1$ of column 6 protruding from the top surface of cap plate 5 is a dead length which does not contribute to the radiating function substantially. When considering the space for installing heat pipe 2, it is desired to eliminate the dead length $L_1$.

When working fluid 9 repeats evaporation and convention, gas pressure in pipe 3 becomes considerably high. The high gas pressure also acts on the crushed portion of column 6. Column 6, having the outer diameter of approximately 1.5 mm, does not have such high strength. Therefore, if the high gas pressure acts on the crushed portion of column 6, the crushed portion sometimes tears. When such a tear is produced, gas in the pipe leaks, carrying out no radiating function.

SUMMARY OF THE INVENTION

An object of the present invention is to provide a heat pipe eliminating a dead length which does not contribute to a radiating function.

Another object of the present invention is to provide a heat pipe which can reliably prevent gas leakage.

A still another object of the present invention is to provide a radiating device effectively utilizing the above-described heat pipe.

The heat pipe according to the present invention includes a pipe having a rectangular cross section, a bottom plate closing the bottom portion of the pipe, a cap plate closing the top portion of the pipe, and a working fluid serving as heat carrier introduced into the pipe and repeating evaporation and condensation. The cap plate includes a vertical aperture extending so as to be penetrated vertically, and a horizontal aperture extending from the side surface to the vertical aperture. A sleeve having a through hole extending vertically is attached to the vertical aperture of the cap plate. The working fluid is introduced into the pipe from the through hole of the sleeve. The sleeve is deformed by impact applied externally through the horizontal aperture, so that the through hole is closed.

In the heat pipe according to one aspect of the present invention, the cap plate closing the upper portion of the pipe does not have a column protruding upward, unlike the conventional heat pipe. Since the column does not contribute to the radiating function, the heat pipe of the present invention reduces the dead length to the utmost which does not contribute to the radiating function.

In the conventional heat pipe, an inlet of the working fluid was closed by crushing the column of the cap plate having low strength. Therefore, there is a possibility that the crushed portion might tear because of the internal gas pressure. In the present invention, an inlet for the working fluid is closed by deforming the sleeve attached in the vertical aperture of the cap plate by impact applied externally through the horizontal aperture. Since the closed portion of the inlet of the working fluid is positioned in the cap plate having relatively high strength, a phenomenon that the crushed portion might tear because of the internal gas pressure is difficult to happen.

In the preferred embodiment, a female screw is formed on the wall surface of the vertical aperture of the cap plate. Correspondingly, a male screw for engaging the female screw is formed on the outer surface of the sleeve.

In another preferred embodiment, solder is formed on the top surface and in the horizontal aperture of the cap plate in order to reliably prevent gas leakage.

According to another aspect of the present invention, a radiating device having superior efficiency of heat reception and superior radiating characteristics can be obtained. The radiating device includes a base block having a plurality of guide grooves on the top surface, and a plurality of heat pipes having the bottom portions fitted to be secured to the guide grooves of the base block. The heat pipe includes a pipe having a rectangular cross section, a bottom plate closing the bottom portion of the pipe, a vertical aperture closing the bottom portion of the pipe and extending so as to be penetrated vertically, a cap plate having a horizontal aperture extending from the side surface to the vertical aperture, a sleeve attached to the vertical aperture of the cap plate and having a through hole extending vertically, and a working fluid serving as heat carrier introduced into the pipe from the through hole of the sleeve and repeating evaporation and condensation. The sleeve is deformed by impact applied externally from the horizontal aperture, so that the through hole is closed.

In the radiating device according to the second aspect, the base block is placed in surface-contact with the top surface of an electronic component. Therefore, heat from the electronic component is efficiently transmitted to the base block. By the heat transmitted from the electronic component, the block as a whole is heated. Since a plurality of heat pipes are erected on the top surface of the base block, heat of the base block is transmitted to the heat pipe. The working fluid sealed in the pipe repeats evaporation and condensation frequently to radiate heat transmitted from the base block to the atmosphere. According to the second aspect, a radiating device having superior efficiency of heat reception and radiating characteristics can be obtained.

In a preferred embodiment, each heat pipe erected on the top surface of the base block is made to have a twisted form. By having a heat pipe made to be twisted, each heat pipe is well ventilated, enhancing radiating effect.

In a still another preferred embodiment of the present invention, the guide groove of the base block has a forth of a dovetail groove, and the bottom plate of the heat pipe has a form of a dovetail fitting into the dovetail groove. The bottom portion of the heat pipe is secured in the guide groove by deforming the top surface of the base block in proximity to the guide groove by impact.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a perspective view and FIG. 2B is a cross section taken along the line B—B in FIG. 2A.

FIGS. 11A and 11B show a conventional heat pipe, in which FIG. 11A and FIG. 11B are a perspective view and a cross section, respectively.

DESCRIPTION OF THE PREFERRED EMBODIMENTS

Figure 1:
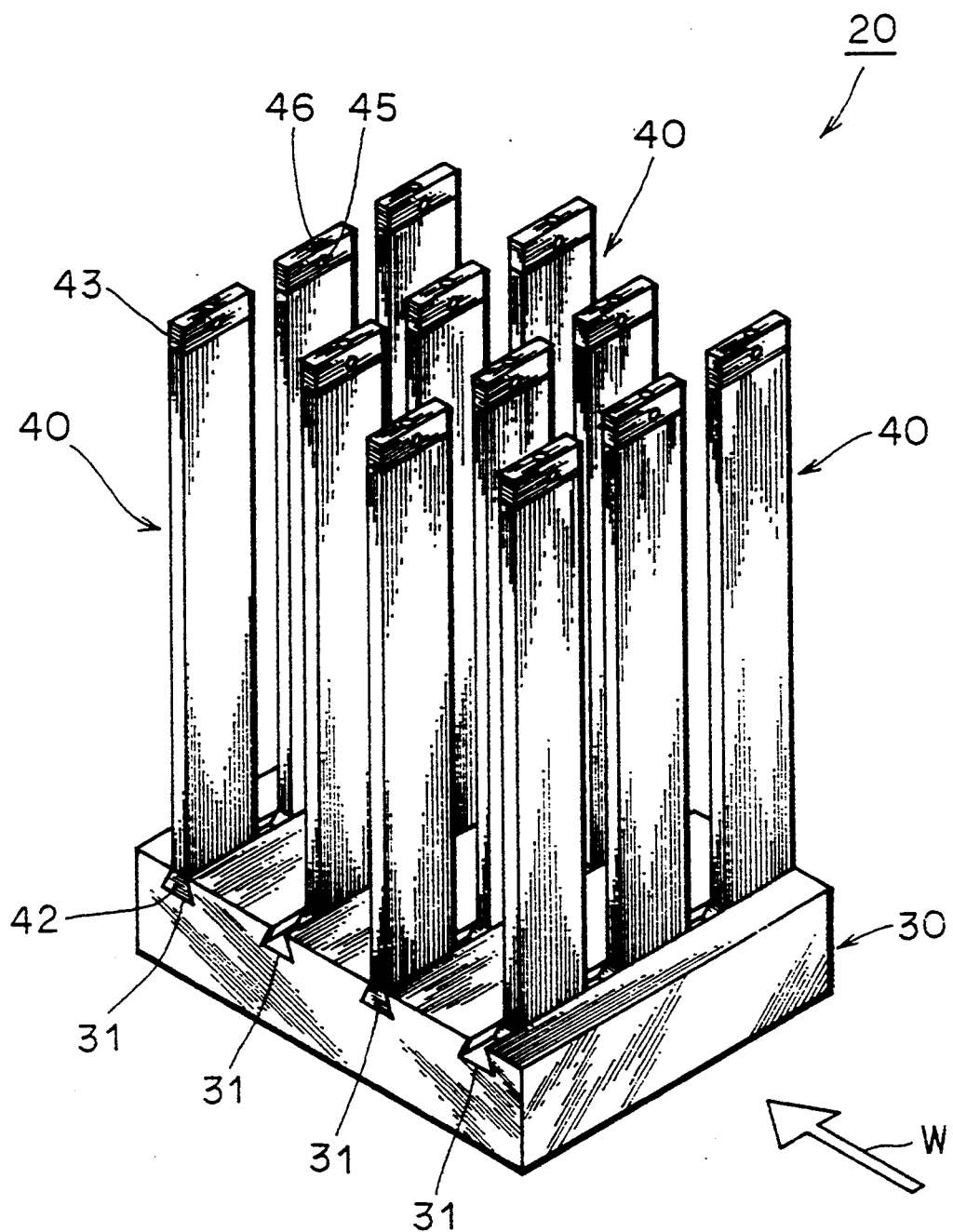
FIG. 1 is a perspective view showing one embodiment of the present invention.

Referring to FIG. 1 showing a radiating device according to the present invention, a radiating device 20 includes a base block 30 having a plurality of dovetail grooves 31 on the top surface, and a plurality of heat pipes 40 having the bottom portions fitted to be secured into dovetail grooves 31 of base block 30. The bottom surface of base block 30 is placed to be in surface-contact with the top surface of an electronic component such as a semiconductor integrated circuit package, and receives heat from the electronic component.

Figure 2A:
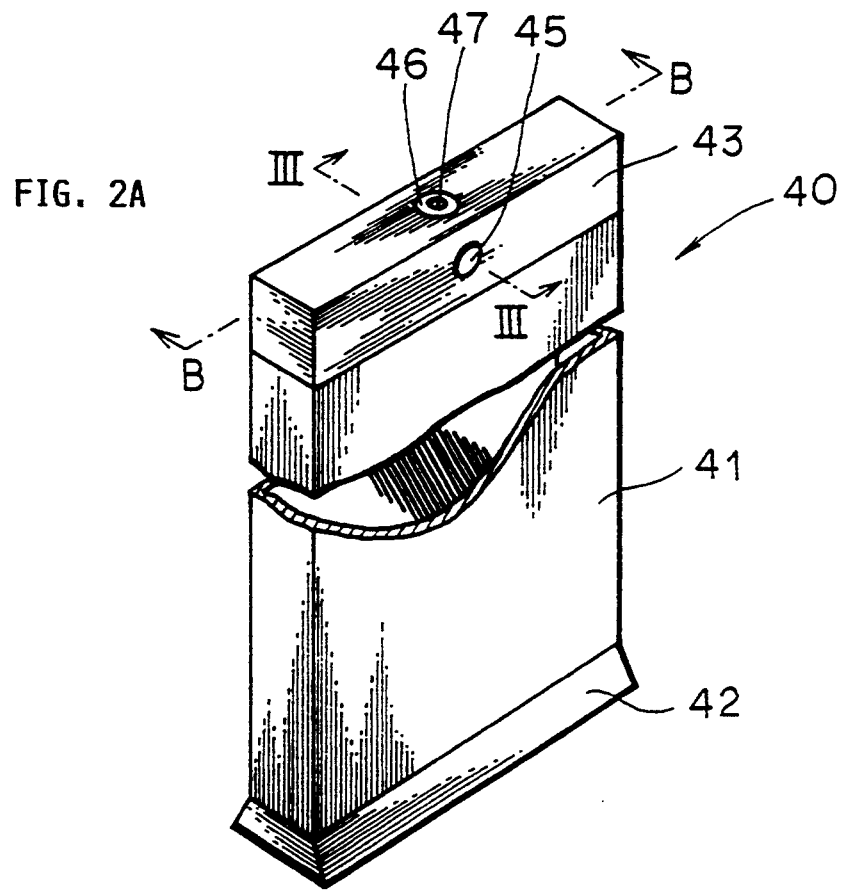
FIGS. 2A and 2B show a radiating device according to the present invention, whereby
Figure 2B:
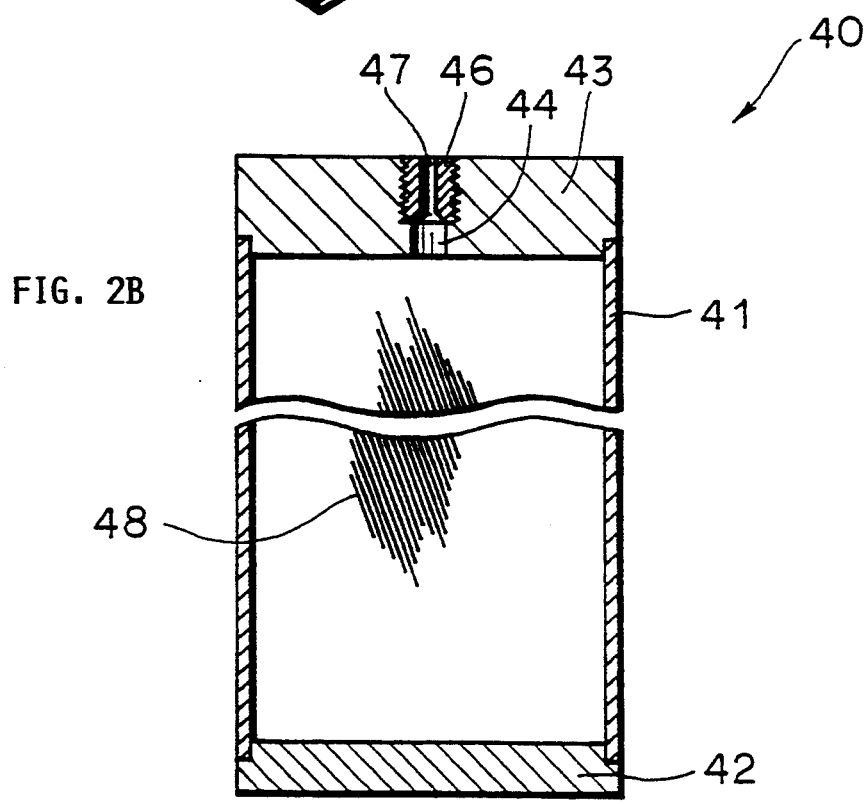

FIGS. 2A and 2B show a heat pipe 40 including a pipe section 41 having a rectangular cross section, a bottom plate 42 closing the bottom portion of the pipe, and a cap plate 43 closing the upper portion of the pipe.

Cap plate 43 has a vertical aperture 44 extending to be penetrated vertically, and a horizontal aperture 45 extending from the side surface to vertical aperture 44. A sleeve 46 having a through hole 47 extending vertically is attached in vertical aperture 44 of cap plate 43. A female screw is formed on the wall surface of vertical aperture 44, and a male screw engaging the female screw is formed in the outer surface of sleeve 46. Therefore, sleeve 46 is screwed into cap plate 43 to be secured.

A working fluid as heat carrier repeating evaporation and condensation is introduced into pipe 41 from through hole 47 of sleeve 46. For the sake of convenience, the working fluid is omitted from the figure.

As shown in FIG. 2B, a number of grooves 48 are formed serving as passages through which the condensed working fluid returns.

As shown in FIG. 2A, bottom plate 42 of heat pipe 40 has a form of a dovetail fitting into dovetail groove 31 of base block 30.

After introduction of the working fluid into heat pipe 40, the inner space of the heat pipe must be tight-sealed. For that purpose, through hole 47 of sleeve 46 attached in cap plate 43 of heat pipe 40 is closed. The steps of closing through hole 47 of sleeve 46 are shown in FIGS. 3A, 3B and 3C.

Figure 3A:
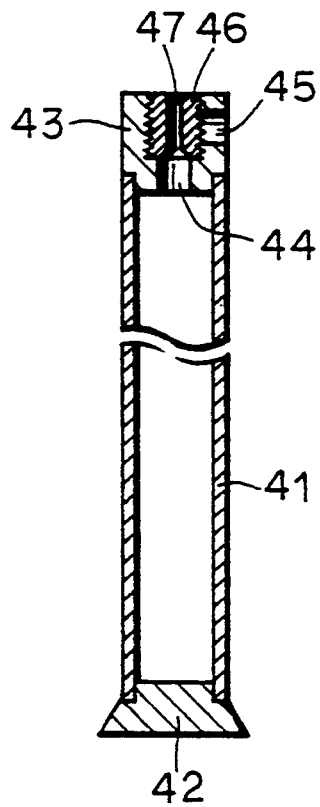
FIGS. 3A, 3B and 3C show cross sections taken along the line III—III of FIG. 2A, showing a sequence of steps for closing through hole 47 of sleeve 46.
Figure 3B:
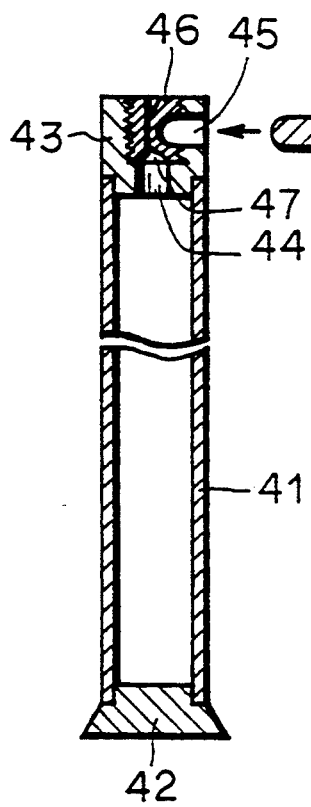

FIG. 3A shows the state before the through hole 47 of sleeve 46 is closed. In this state, as shown in FIG. 3B, a rod 60 is driven into horizontal aperture 45 of cap plate 43 from the outside. Sleeve 46 is deformed by the impact of the rod 60, so that through hole 47 of sleeve 46 is closed. In addition, deformation of sleeve 46 strengthens adhesion between sleeve 46 and cap plate 43.

Figure 3C:
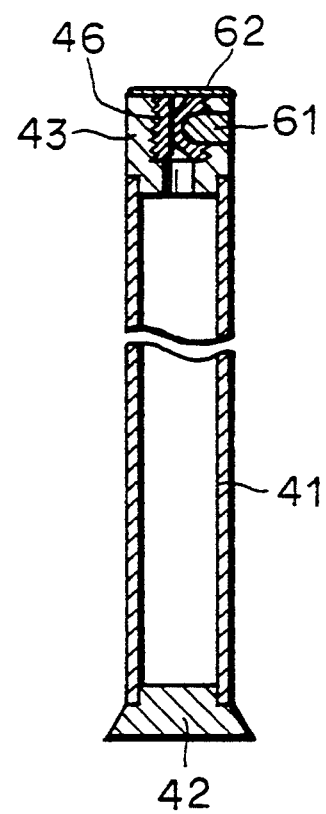

As shown in FIG. 3C, in order to reliably prevent gas leakage, a solder 62 is applied to the top surface of cap plate 43, and horizontal aperture 45 is also filled with a solder 61.

During the repetition of evaporation and condensation of the working fluid in heat pipe 40, gas pressure in pipe 41 is increased. Although the gas pressure also acts on the closed portion of sleeve 46, since the closed structure of sleeve 46 is strong, it is not possible that sleeve 46 might tear to cause gas leakage.

Figure 4A:
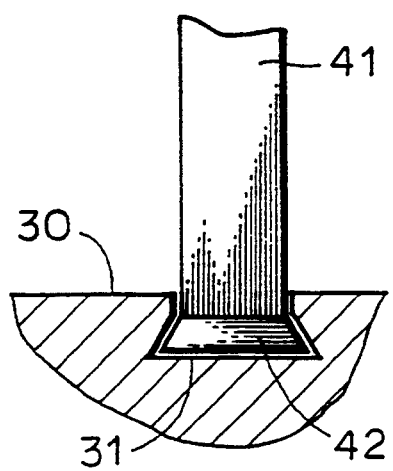
FIGS. 4A and 4B are cross sections through a base block showing the attachment of a foot of the heat pipe to the base block.
Figure 4B:
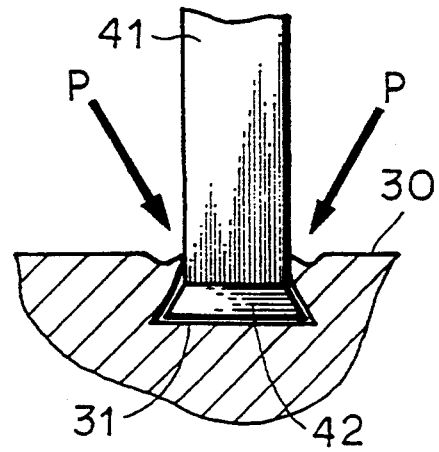

After tight-sealing the working fluid in heat pipe 40, heat pipe 40 is fitted to be secured into the dovetail groove of base block 30. FIGS. 4A and 4B show the states before and after heat pipe 40 is secured to a base block or foot 30. As shown in FIG. 4A, bottom plate 42 of heat pipe 40 is fitted into dovetail groove 31 of base block 30. In this state, heat pipe 40 can be moved along the longitudinal direction of dovetail groove 31. After moving heat pipe 40 along dovetail groove 31 to a predetermined position, the top surface of base block 30 in proximity to dovetail groove 31 is deformed by, for example, press working, as shown by an arrow P in FIG. 4B. This deformation secures bottom plate 42 of heat pipe 40 in dovetail groove 31 strongly.

Welding, blazing and the like are considered to be methods for adhering heat pipe 40 onto the top surface of base block 30. However, welding, blazing and the like contribute to heating heat pipe 40 to a considerably high temperature. Therefore, gas pressure in the heat pipe is abruptly increased, possibly causing puncture of the heat pipe. In order to avoid such a risk, heat pipe 40 is secured to base block 30 by press working as shown in FIG. 4.

Figure 5:
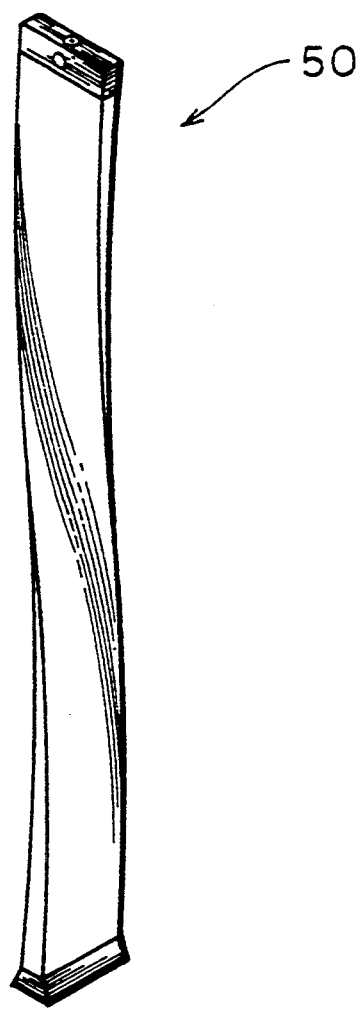
FIG. 5 is a perspective view showing another example of the heat pipe according to the present invention.

FIG. 5 shows another example of a heat pipe. A heat pipe 50 as shown has a twisted form. Heat pipe 50 shown in FIG. 5 has the same structure as the aforementioned heat pipe 40 except for being in the twisted form.

Figure 6:
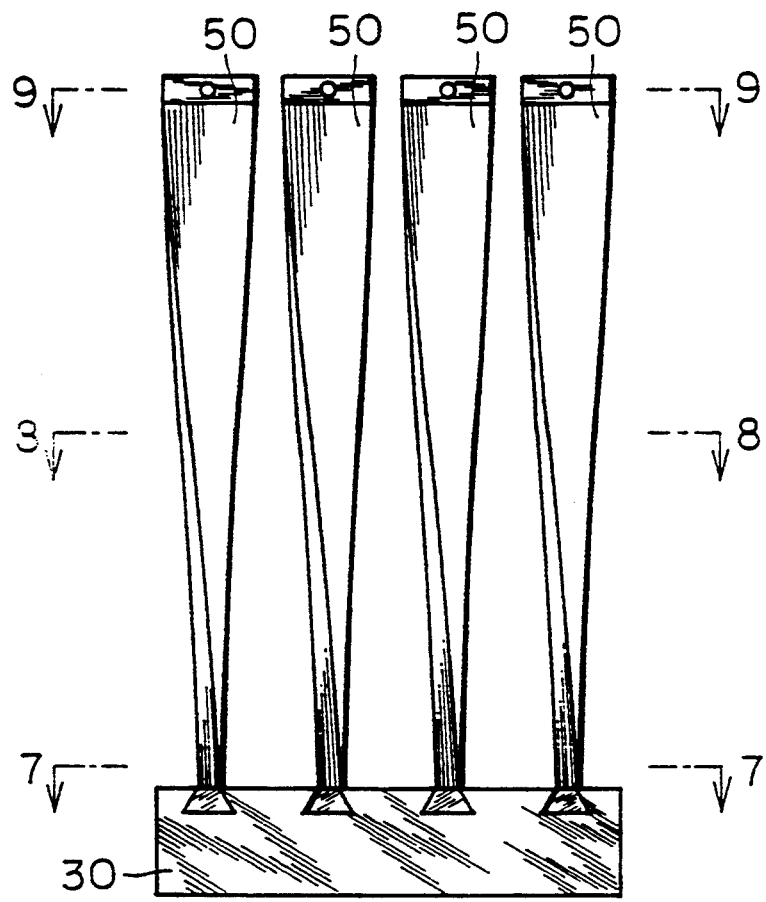
FIG. 6 is a front view with the heat pipe shown in FIG. 5 attached to the base block.
Figure 7:
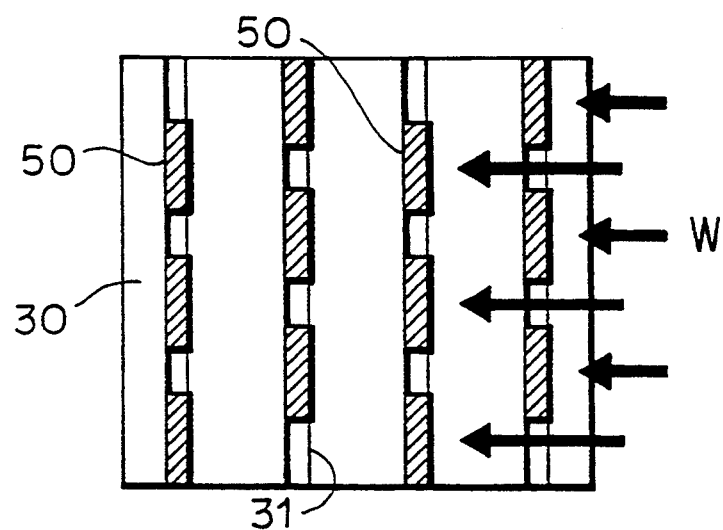
FIG. 7 is a cross section taken along the line 7—7 of FIG. 6.
Figure 8:
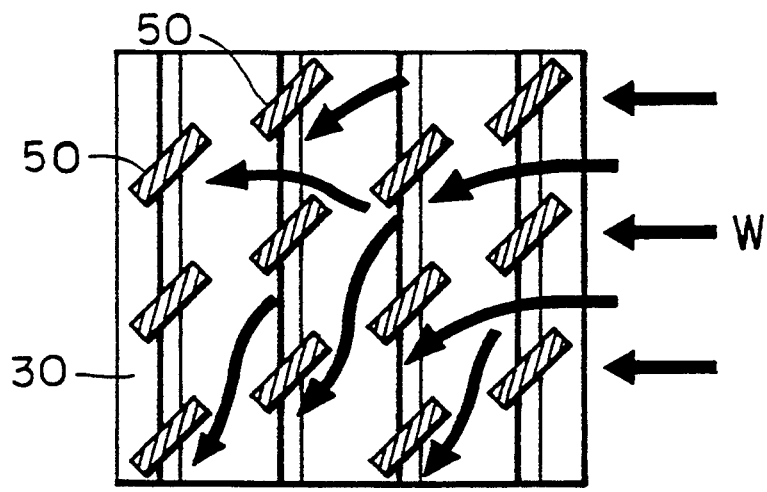
FIG. 8 is a cross section taken along the line 8—8 of FIG. 6.
Figure 9:
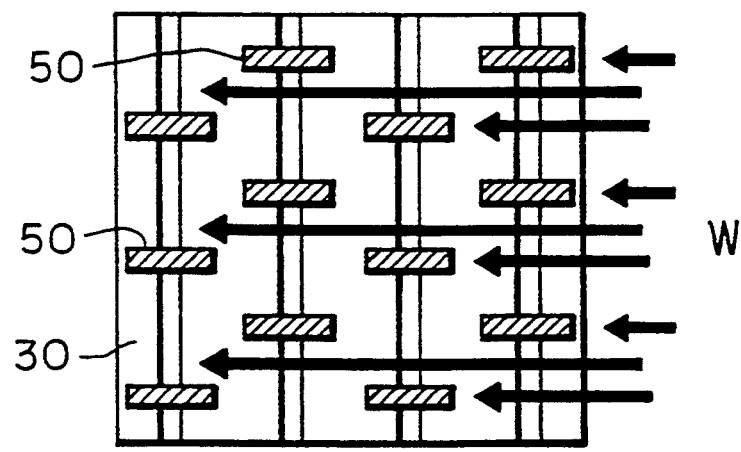
FIG. 9 is a cross section taken along the line 9—9 of FIG. 6.
Figure 10:
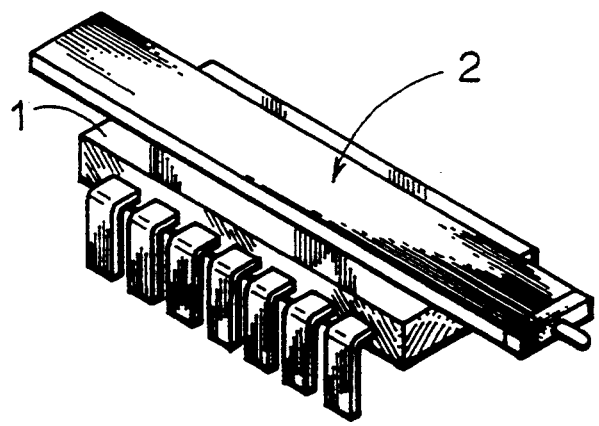
FIG. 10 is a perspective view showing the state when the conventional heat pipe is placed on the semiconductor integrated circuit package.
Figure 11A:
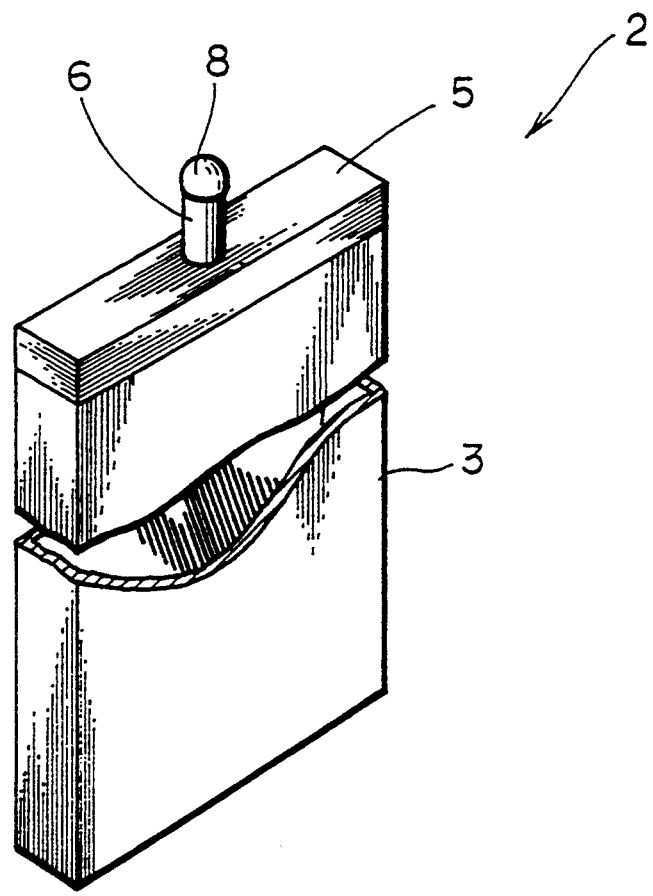
Figure 11B:
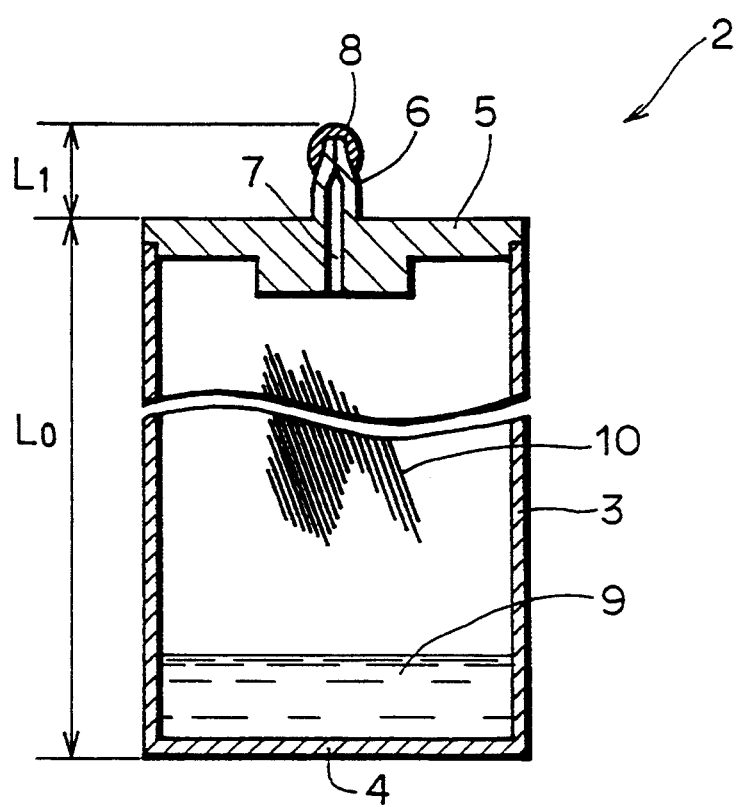
Figure 12A:
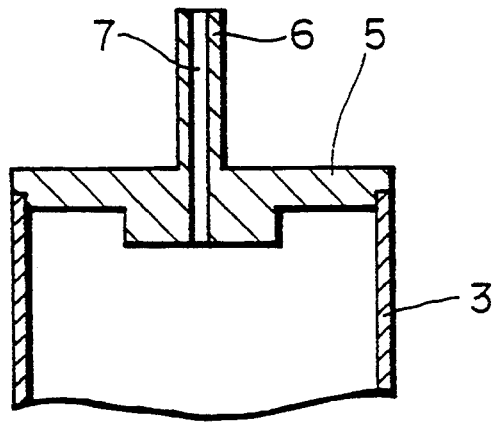
FIGS. 12A, 12B and 12C are cross section views showing as sequence of steps for squeezing a column of the cap plate of the conventional heat pipe.
Figure 12B:
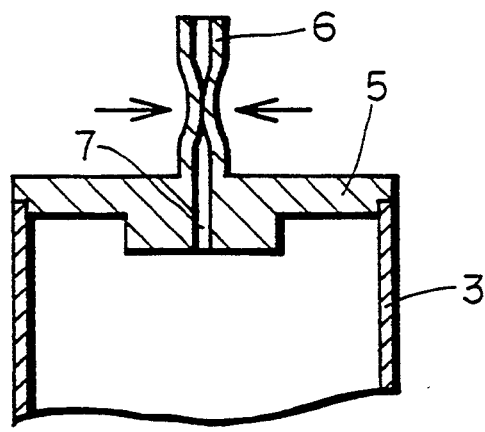
Figure 12C:
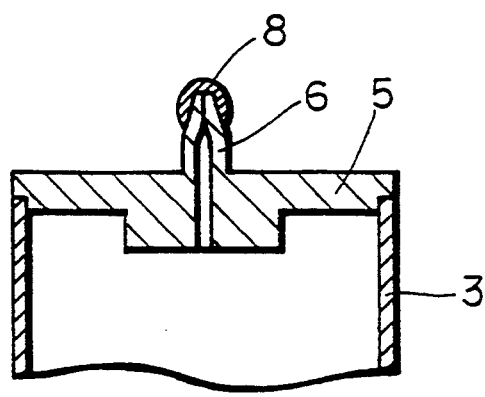

FIG. 6 shows the state when heat pipe 50 in the twisted form is attached to base block 30. FIGS. 7, 8 and 9 show cross sections taken along the lines 7—7, 8—8 and 9—9 of FIG. 6, respectively. According to the radiating device shown in FIGS. 6 to 9, respective heat pipes 50 are well exposed to the wind.

For example, in radiating device 20 shown in FIG. 1, assuming that the wind flows in the direction shown by an arrow W, heat pipe 40 positioned upwind is exposed to the wind, while heat pipe 40 positioned downwind is hardly exposed to the wind. In the radiating device shown in FIGS. 6 to 9, since each heat pipe 50 has a twisted form, the wind passes through in any location in the vertical direction, and even the heat pipe positioned downwind is exposed to the wind. Furthermore, the wind causes turbulence along the twist of the heat pipe. Therefore, since the heated air radiated from each heat pipe is pushed away with the wind, superior radiating effect can be obtained.

In the above-described embodiments, the radiating device includes a heat pipe and a base block. However, only a heat pipe can be used as a radiating device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heat pipe, comprising: a pipe section having a rectangular cross-section; a bottom plate closing a bottom portion of said pipe section; a cap plate closing a top portion of said pipe section to enclose a space in said pipe section, said cap plate having a first aperture extending in a first direction through said cap plate, and a second aperture extending in a second direction from a side surface of said cap plate to said first aperture; a sleeve inserted in said first aperture of said cap plate, said sleeve having a through hole extending in said first direction for communication with said space; and a working fluid introduced into said space through said through hole of said sleeve said working fluid serving as a heat carrier by repeated evaporation and condensation, said sleeve being deformed by an impact externally applied through said second aperture, so that said through hole is closed.

2. The heat pipe according to claim 1, wherein a wall surface of said first aperture of said cap plate comprises a female threading, and wherein said sleeve comprises a male external threading engaging said female threading.

3. The heat pipe according to claim 1, wherein a solder is disposed on a top surface and in said second aperture of said cap plate.

4. The heat pipe of claim 1, wherein said pipe section has a twisted configuration.

5. The heat pipe of claim 1, wherein said bottom plate has a dovetail cross-sectional configuration.

6. The heat pipe of claim 1, further comprising a base block for supporting said bottom plate of said pipe section.

7. The heat pipe of claim 6, wherein said base block comprises a top surface and at least one guide groove in said top surface, said bottom plate of said pipe section being secured in said guide groove.

8. The heat pipe of claim 7, wherein said guide groove and said bottom plate each have a dovetail cross-sectional configuration so that said bottom plate fits into said guide groove.

9. The heat pipe of claim 8, further comprising at least one impact impression (P) in said base block for anchoring said dovetail cross-sectional configuration of said bottom plate in said guide groove.

* * * * *